United States Patent [19]

Tseng

[11] Patent Number: 5,508,223
[45] Date of Patent: Apr. 16, 1996

[54] METHOD FOR MANUFACTURING DRAM CELL WITH FORK-SHAPED CAPACITOR

[75] Inventor: Horng-Huei Tseng, Hsin Chu, Taiwan

[73] Assignee: Vanguard International Semiconductor Corporation, Hsinchu, Taiwan

[21] Appl. No.: 435,202

[22] Filed: May 5, 1995

[51] Int. Cl.[6] ............................................. H01L 21/70
[52] U.S. Cl. ........................... 437/60; 437/47; 437/48; 437/52; 437/919
[58] Field of Search ................... 437/47, 48, 52, 437/60, 919; 257/300, 301, 302, 303, 304, 305, 306, 307, 308, 309

[56] References Cited

U.S. PATENT DOCUMENTS

| | | | |
|---|---|---|---|
| 5,045,899 | 9/1991 | Arimoto | 257/306 |
| 5,047,817 | 9/1991 | Wakamiya et al. | 257/306 |
| 5,049,517 | 9/1991 | Liu et al. | 437/52 |
| 5,084,405 | 1/1992 | Fazan et al. | 437/52 |
| 5,126,916 | 6/1992 | Tseng | 257/306 |
| 5,278,437 | 1/1994 | Wakamiya et al. | 257/308 |
| 5,292,677 | 3/1994 | Dennison | 437/52 |
| 5,315,140 | 5/1994 | Sugahara et al. | 257/306 |
| 5,366,917 | 11/1994 | Watanabe et al. | 437/60 |

FOREIGN PATENT DOCUMENTS 3276671  12/1991  Japan ............................ 257/300

Primary Examiner—Tom Thomas
Assistant Examiner—Kevin M. Picardat
Attorney, Agent, or Firm—George O. Saile

[57] ABSTRACT

An efficient method for manufacturing a fork-shaped capacitor, for use as part of a DRAM cell, is described. Starting with a partially completed silicon integrated circuit, comprising a plurality of Field Effect Transistors, the electrode contacting the gate region is given the shape of a hollow rectangle. One side contacts the gate region while the parallel side is on a layer of field oxide, adjacent to it and separated from it by the source region. The structure is then coated with a first layer of silicon oxide which is then selectively removed so as not to cover the interior of the gate electrode. Then the structure is coated with a first layer of doped polysilicon and with a second layer of silicon oxide, the part that overlies the interior of the gate being then selectively removed. The entire structure is now conformally coated with a third layer of silicon oxide which is then etched back down to the level of the first polysilicon layer, leaving the second layer of silicon oxide substantially unaltered. Thus, spacers are formed that extend inwards from the vertical walls of said second layer of silicon oxide, partially covering the exposed portion of the first layer of polysilicon. The latter is then etched, down to the level of the upper surface of the gate electrode, and the second layer of silicon oxide, including the spacers, is then removed. Next, all of the first layer of polysilicon is removed, except the part that overlies the gate interior and overlaps the first layer of silicon oxide. The first layer of polysilicon is now ready to serve as a bottom electrode for the capacitor which is completed by depositing a dielectric layer and a top electrode layer.

15 Claims, 5 Drawing Sheets

METHOD FOR MANUFACTURING DRAM CELL WITH FORK-SHAPED CAPACITOR

BACKGROUND OF THE INVENTION (1) Field of the Invention

The invention relates to the general field of silicon integrated circuits, more particularly to Dynamic Random Access Memories and capacitors used therein.

(2) Description of the Prior Art

Dynamic Random Access Memories (DRAMs), as used in silicon integrated circuits, represent semiconductor devices that offer information storage at very high densities. These high densities are a consequence of the fact that the basic cell of a DRAM (wherein a single bit of information is stored) comprises a single Field Effect Transistor (FET) and a capacitor. The minimum capacitance required for the basic cell to operate efficiently is about 20 femtofarads. This implies that the capacitor, rather than the FET, will be the limiting factor in determining how small the DRAM's basic cell can be made.

Capacitance value can be increased in any of three ways: the dielectric layer may be made thinner, the dielectric constant may be increased, and the area of the electrodes may be increased. The first two ways are limited by the availability of materials with suitable properties such as breakdown strength, high frequency characteristics, etc. so that most of the work to reduce the physical size of the capacitor in a DRAM cell has concentrated on increasing the effective area of the electrodes without increasing the amount of space within the integrated circuit that is taken up by the capacitor.

One of the geometries that has been successfully used to increase the effective area of the capacitor electrodes is to shape the capacitor in the form of a rectangular prism, at least one of whose surfaces is dimpled in some way such as rectangular or cylindrical depressions. The fork-shape capacitor is an example of this and is the geometry on which the present invention is based.

Dennison (U.S. Pat. No. 5,292,677 Mar. 8, 1994) describes processes that relate primarily to the DRAM cell as a whole, but also includes an example of a capacitor with a depression running along its center. This depression is the result of the various deposited layers following the natural contours of the structure, particularly the interior of the hollow rectangle that comprises the gate electrode. It is relatively limited in extent and so increases the effective area of the capacitor electrodes by only a small amount. The present invention achieves a more efficient geometry using a simpler process.

SUMMARY OF THE INVENTION

It has been an object of the present invention to describe an efficient method for manufacturing a fork-shape capacitor.

This has been achieved by using the following steps:

(a) providing a partially completed silicon integrated circuit structure comprising a plurality of Field Effect Transistors, each having source, drain, and gate regions, the electrode contacting said gate region having the shape of a hollow rectangle with one side contacting said gate region and the parallel side being on a layer of field oxide, adjacent to said gate region and separated from it by said source region;

(b) then coating the structure with a first layer of silicon oxide which is then selectively removed so that it does not cover the interior of said gate electrode;

(c) then coating the structure with a first layer of doped polycrystalline silicon and with a second layer of silicon oxide;

(d) then selectively removing that part of said second layer of silicon oxide that overlies the interior of said gate;

(e) then conformally coating the entire structure with a third layer of silicon oxide;

(f) then etching back said third layer of silicon oxide down to the level of said first layer of polycrystalline silicon, leaving said second layer of silicon oxide substantially unaltered, thereby forming spacers that extend inwards from the vertical walls of said second layer of silicon oxide, partially covering the exposed portion of said first layer of polycrystalline silicon;

(g) then etching said first layer of polycrystalline silicon down to the level of the upper surface of said gate electrode;

(h) then removing said second layer of silicon oxide, including said spacers;

(i) then selectively removing all of said first layer of polycrystalline silicon except the part that overlies the interior of said gate and overlaps said first layer of silicon oxide, thereby forming said first layer of polycrystalline silicon into a bottom electrode;

(j) then coating said bottom electrode with a layer of a capacitor dielectric and then coating said capacitor dielectric layer with a second layer of polycrystalline silicon, thereby forming a top electrode.

DESCRIPTION OF THE PREFERRED EMBODIMENTS

This description of the preferred method for manufacturing the forked-shape capacitor begins at a point in the manufacturing process where the integrated circuit is partially completed and comprises a plurality of Field Effect Transistors (FETs), each of which will form a single cell of the DRAM in combination with a forked-shape capacitor.

Figure 1:
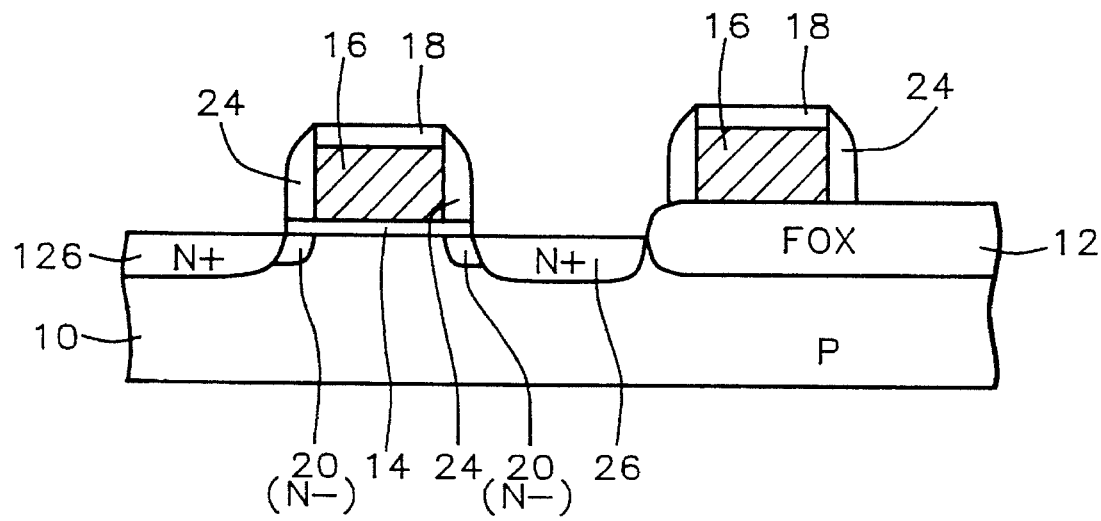
FIG. 1 is a schematic cross-section through a partially completed silicon integrated circuit, representing the starting point for the present invention.

Referring now to FIG. 1 we show, in schematic cross-section, a single FET formed on silicon body 10. The particular example shown here is of an FET that was produced by the Low Density Drain Self Aligned silicide (LDD salicide) process, but it will be understood by anyone skilled in this art that the capacitor forming method that is about to be described will work just as well for other types of FET, including both N-P-N and P-N-P types. Shown in FIG. 1 is source region 26, drain region 126 and gate oxide 14. Regions 26 and 126 each comprise N+ silicon (in this example). In addition, a small subregion of N− silicon 20 underlies oxide spacers 24.

Gate electrode 16 in FIG. 1 has the shape of a hollow rectangle. In the cross-section used here, one edge of this rectangle is shown to overlie the gate oxide 14 while the parallel edge is shown as overlying Field Oxide (FOX) 12. The object of the method is to build the capacitor in the interior of the hollow rectangle that comprises the gate electrode.

Figure 2:
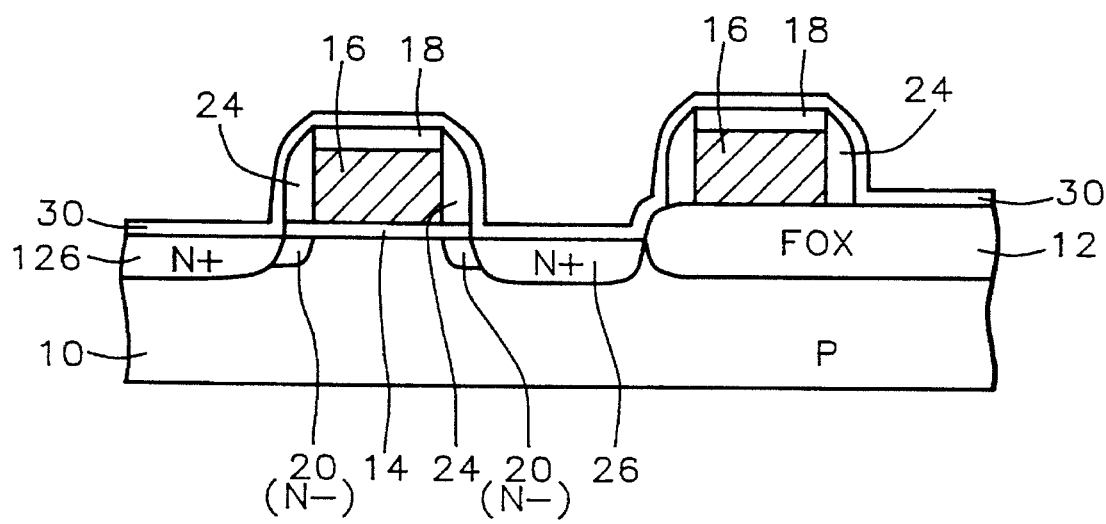
FIGS. 2 through 9 show successive steps (all as schematic cross-sections) that comprise the method of the present invention.

Referring to FIG. 2, the method begins with the deposition of a layer of silicon oxide 30. Standard photolithographic and etching techniques were then used to remove layer 30 from the interior of the hollow rectangle that comprises gate electrode 16, thereby forming opening 49 (shown in FIG. 3). The method that was used to deposit silicon oxide layer 30 was Chemical Vapor Deposition (CVD) and its thickness was between 500 and 2,000 Angstrom units.

Figure 3:
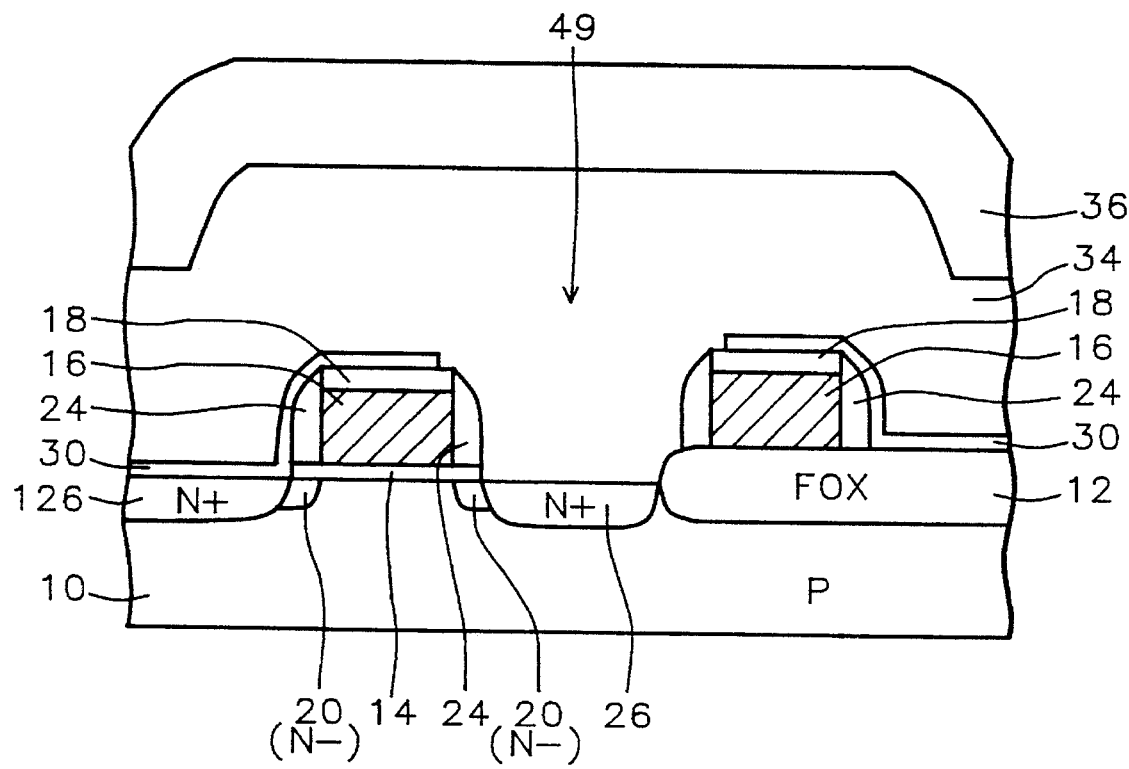

Referring to FIG. 3, the next step was to deposit a first layer of polycrystalline silicon (poly) 34, doped in situ through CVD at 570° C. using a mix of silane and phosphine, to a thickness between 3,000 and 8,000 Angstrom units, followed by second silicon oxide layer 36 (also by means of CVD) to a thickness of between 1,000 and 3,000 Angstrom units.

Figure 4:
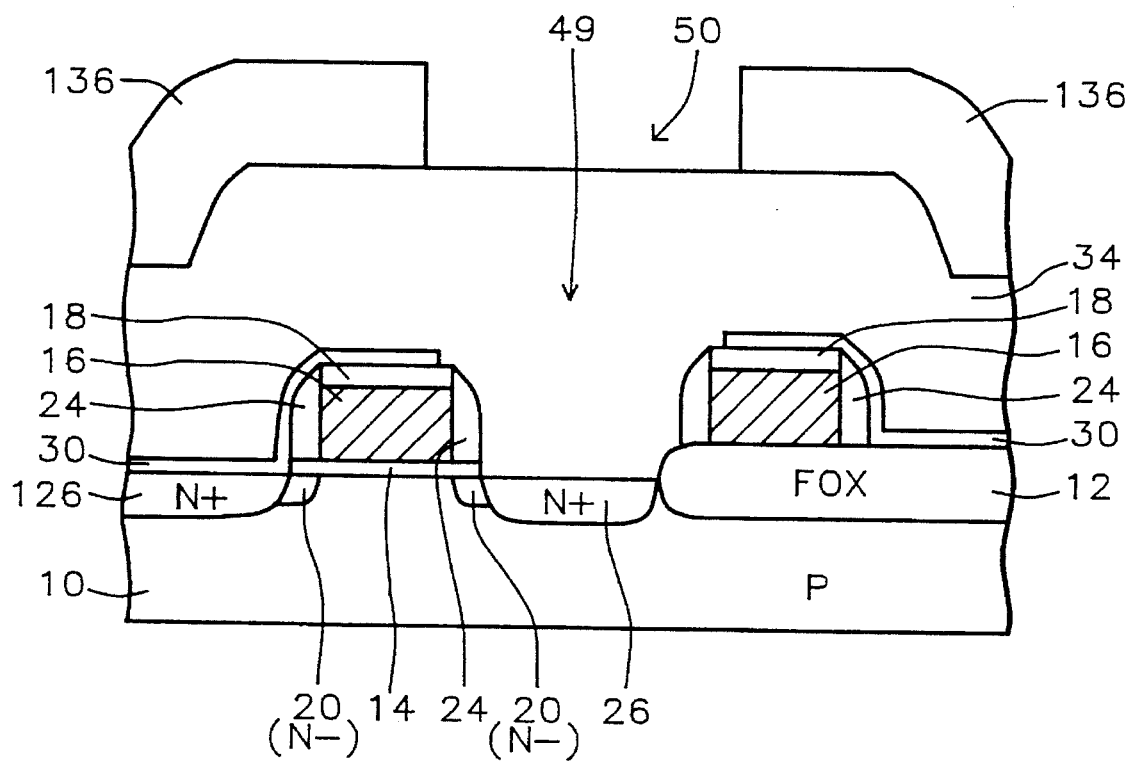

As shown in FIG. 4, trench 50 (seen in cross-section) is then etched in silicon oxide layer 36 (which is now designated as layer 136) using standard photolithographic techniques. Trench 50 is slightly wider than opening 49 in oxide layer 30.

Figure 5:
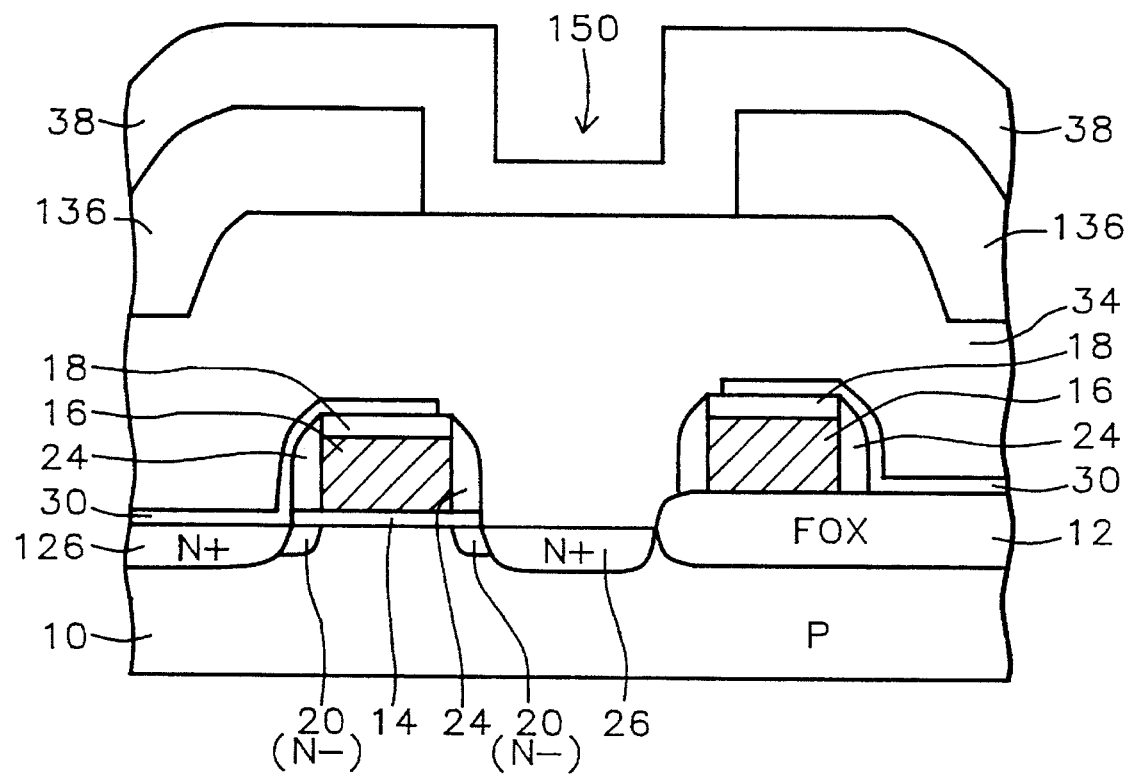

Referring now to FIG. 5, silicon oxide layer 38 is now deposited over the entire structure, again using CVD, to a thickness between 1,000 and 3,000 Angstrom units. Layer 38 deposits in a conformal manner so the appearance is as shown. Trench 50 has now been replaced by trench 150 which is narrower.

Figure 6:
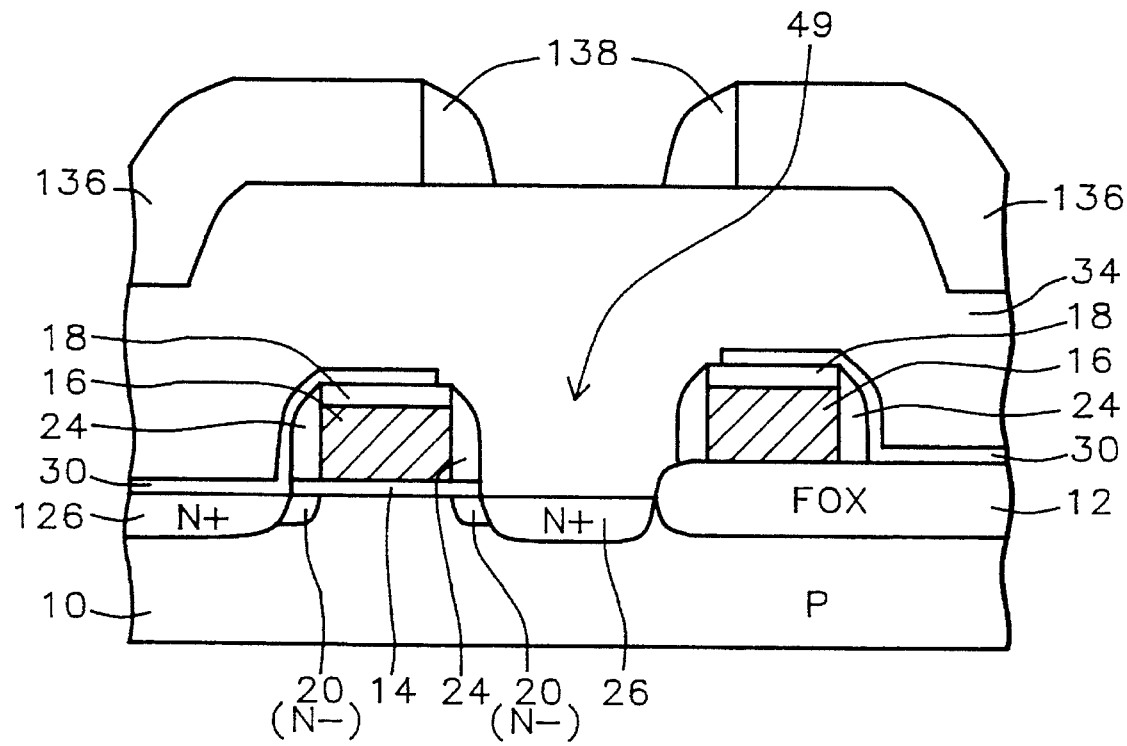

Silicon oxide layer 38 is now etched back to the level of poly layer 34. This is performed anisotropically by means of Reactive Ion Etching (RIE) in a mix of $CHF_3$, $CF_4$, and Ar so that, at the conclusion of this step, the appearance is as illustrated in FIG. 6. Note that oxide spacers 138 (all that remains of layer 38) now cover a portion of layer 34, so the area of 34 that is exposed has been reduced relative to what it was in FIG. 4. This is important because, had trench 50 been used as the mask for the next step below, its lowest reliable width would have been around 0.3 micron (due to limitations imposed by the resolution of the optical system) whereas, by growing the spacers, this minimum width is reduced to about 0.1 microns.

Figure 7:
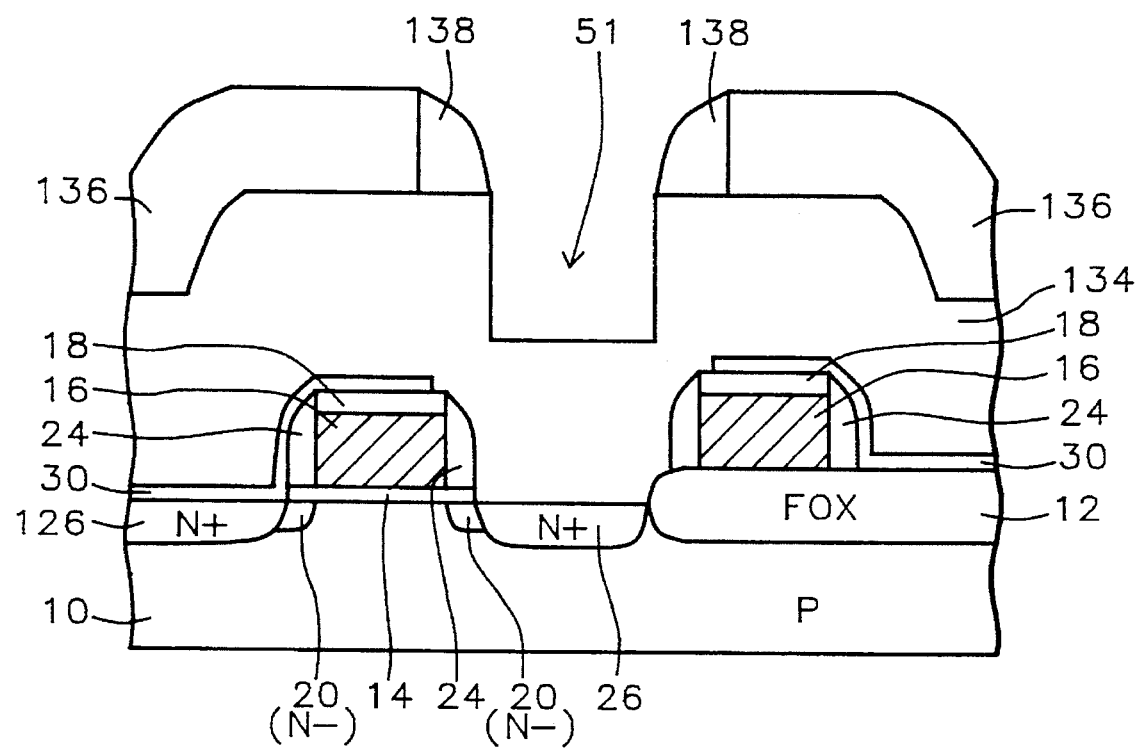
Figure 8:
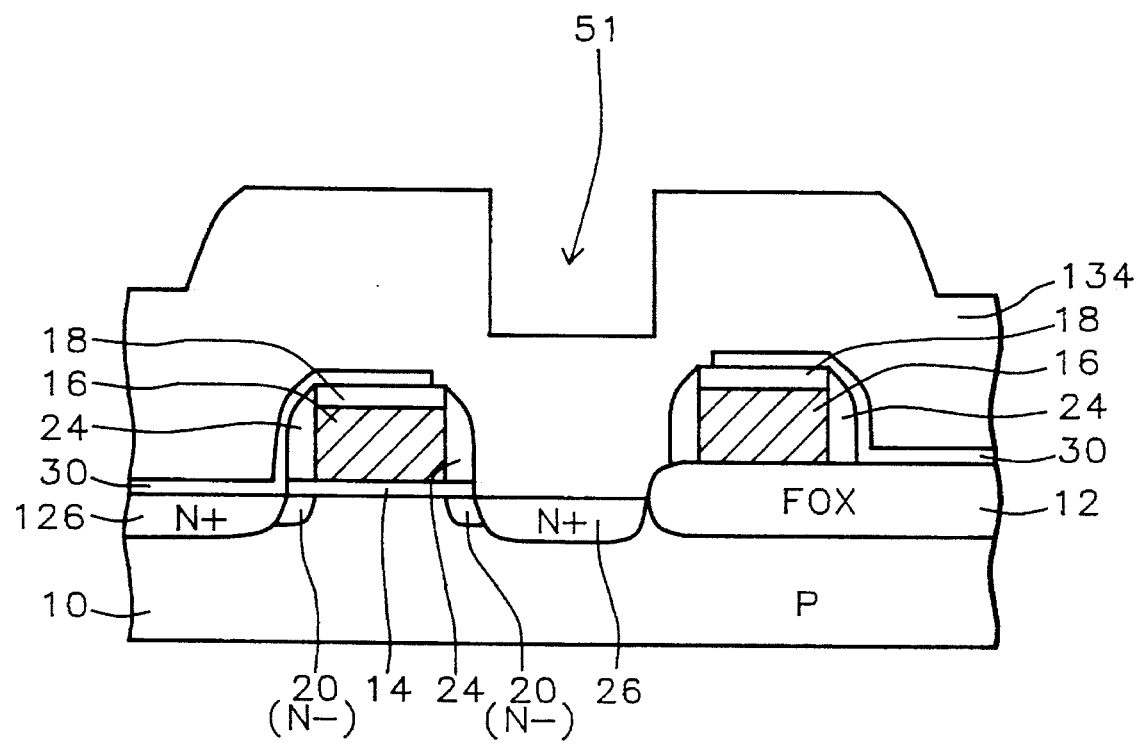

The unprotected portion of poly layer 34 is now etched using a Rainbow 4400 etcher (manufactured by Lam Research, U.S.A.) at a power setting of 450 watts and a pressure of 450 millitorr. Gases used during the etching comprised helium at 180 Standard Cubic Centimeters per minute (SCCM) and chlorine at 420 SCCM. This causes trench 51 to be formed (as shown in FIG. 7) in poly layer 134 (formerly 34) and is followed by the removal of silicon oxide layer 136, including spacers 138, so the structure now appears as shown in FIG. 8.

Figure 9:
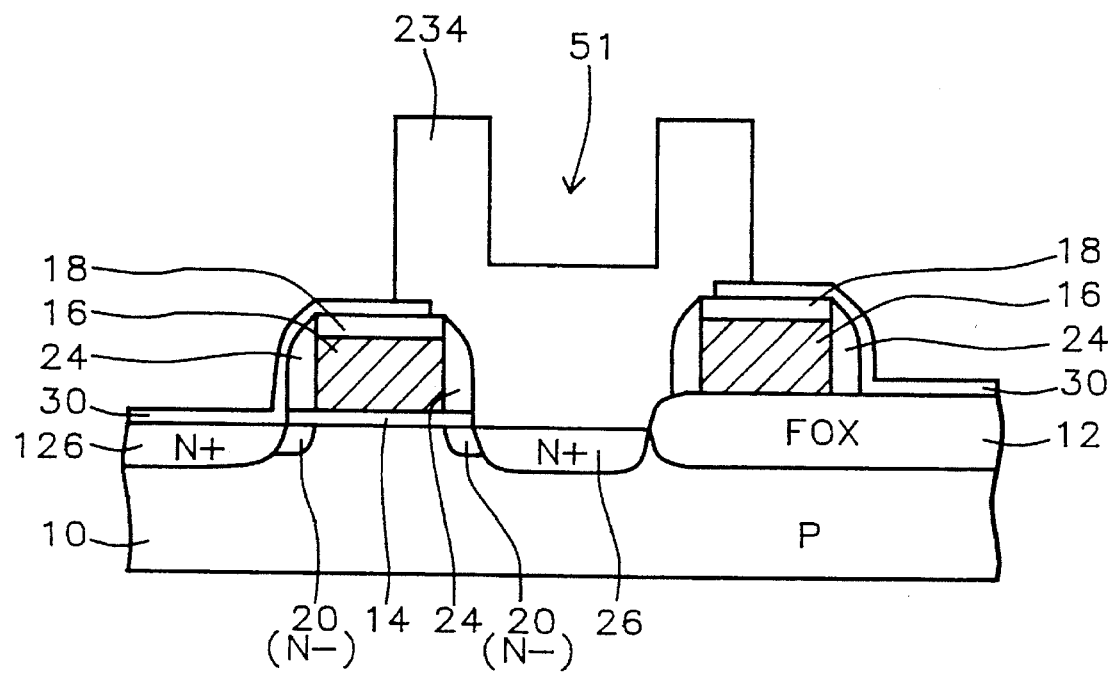

Referring now to FIG. 9, poly layer 134 is selectively removed, using standard photolithographic and etch techniques. All that remains of 134 (now designated as 234) is the portion that overlies the interior of gate 16, including a slight overlap of silicon oxide layer 30. Layer 234 now has the required shape for it to serve as a bottom electrode for the capacitor. As can be seen in FIG. 9, this electrode (in cross-section) has the appearance of a two pronged fork, hence the name fork-like capacitor.

Figure 10:
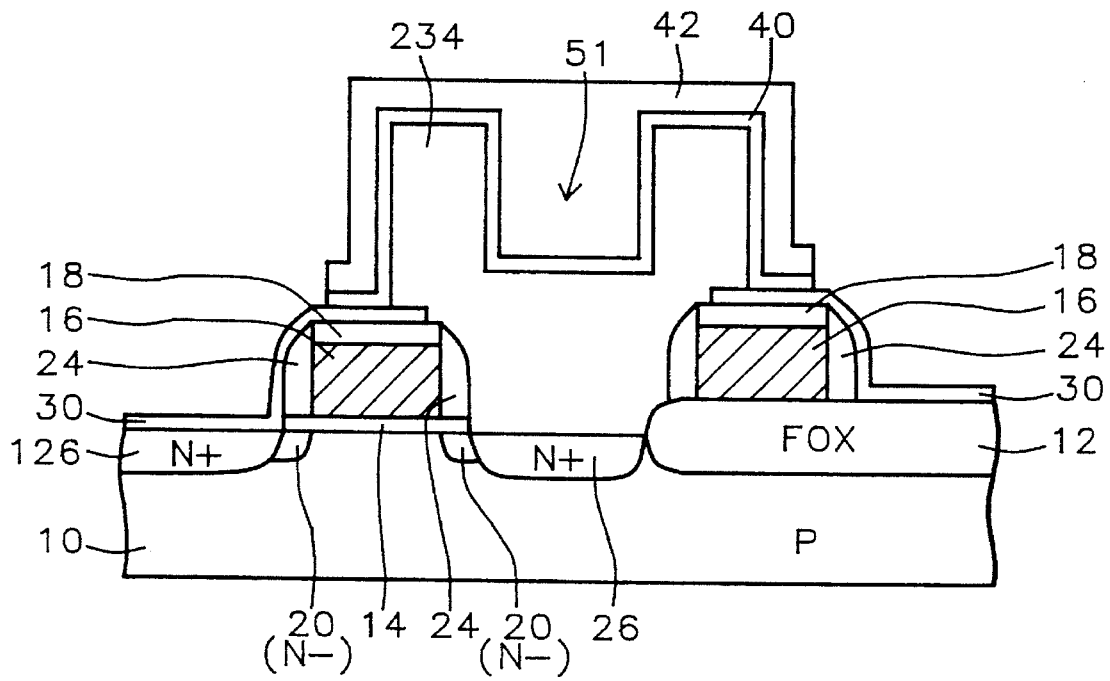
FIG. 10 is a schematic cross-section of the end-product of the present invention.

Referring now to FIG. 10, a capacitor dielectric layer 40 was conformally deposited onto the surface of bottom electrode 234 to a thickness between 10 and 90 Angstrom units. Our preferred material for layer 40 has been a triple layer comprising $SiO_2/Si_3N_4/SiO_2$ (ONO), but any suitable dielectric material such as Tantalum Oxide could be used. The preferred method for depositing ONO layer 40 has been:

Bottom O—expose poly to deionized water

Middle N—Low Pressure CVD, silane and ammonia, 760° C., 350 millitorr

Top O—heat in dry oxygen, 850° C. for 30 minutes.

To complete fabrication of the capacitor a second doped poly layer 42 was deposited over dielectric layer 40 to a thickness between 1,000 and 3,000 Angstrom units. Layers 40 and 42 were then selectively etched so that they did not extend beyond the edges of gate electrode 16, thereby providing a top electrode.

While the invention has been particularly shown and described with reference to this preferred embodiment thereof, it will be understood by those skilled in the art that various changes in form and details may be made without departing from the spirit and scope of the invention.

What is claimed is:

1. A method for manufacturing a forked-shape capacitor as part of a Dynamic Random Access Memory cell, comprising:

(a) providing a partially completed silicon integrated circuit structure further comprising a plurality of Field Effect Transistors, each having source, drain, and gate regions, the electrode contacting said gate region having the shape of a hollow rectangle with an interior, one side contacting said gate region and the parallel side on a layer of field oxide, adjacent to said gate region and separated from it by said source region;

(b) then coating the structure with a first layer of silicon oxide which is then selectively removed so that it does not cover the interior of said gate electrode;

(c) then coating the structure with a first layer of doped polycrystalline silicon and with a second layer of silicon oxide;

(d) then selectively removing that part of said second layer of silicon oxide that overlies the interior of said gate;

(e) then conformally coating the entire structure with a third layer of silicon oxide;

(f) then anisotropically etching said third layer of silicon oxide down to the level of said first layer of polycrystalline silicon, thereby leaving said second layer of silicon oxide unaltered, and thereby forming spacers that extend inwards from the vertical walls of said second layer of silicon oxide, partially covering the exposed portion of said first layer of polycrystalline silicon;

(g) then etching said first layer of polycrystalline silicon down to the level of the upper surface of said gate electrode;

(h) then removing said second layer of silicon oxide, including said spacers;

(i) then selectively removing all of said first layer of polycrystalline silicon except the part that overlies the interior of said gate and overlaps said first layer of silicon oxide, thereby forming said first layer of polycrystalline silicon into a bottom electrode;

(j) then coating said bottom electrode with a layer of a capacitor dielectric; and (k) then coating said capacitor dielectric layer with a second layer of polycrystalline silicon, thereby forming a top electrode.

2. The method of claim 1 wherein the method used for depositing polycrystalline silicon comprises Low Pressure CVD with silane flowing at rates between 1000 and 1,500 SCCM and phosphine flowing at rates between 190 and 210 SCCM at a temperature between 500° and 650° C.

3. The method of claim 1 wherein the method used for depositing silicon oxide comprises chemical vapor deposition.

4. The method of claim 1 wherein the doping level of said first layer of polycrystalline silicon is sufficient to cause the sheet resistance of said first layer of polycrystalline silicon to be between 5 and 25 ohms/square.

5. The method of claim 1 wherein the thickness of said first layer of polycrystalline silicon is between 3,000 and 8,000 Angstrom units.

6. The method of claim 1 wherein the thickness of said first layer of silicon oxide is between 500 and 2,000 Angstrom units.

7. The method of claim 1 wherein the thickness of said second layer of silicon oxide is between 1,000 and 3,000 Angstrom units.

8. The method of claim 1 wherein the thickness of said third layer of silicon oxide is between 1,000 and 3,000 Angstrom units.

9. The method of claim 1 wherein the method used for removing said third layer of silicon oxide and said spacers comprises etching in dilute hydrofluoric acid.

10. The method of claim 1 wherein the method used for removing said first layer of polycrystalline silicon comprises RIE with helium flowing between 160 to 200 SCCM and chlorine flowing between 380 and 460 SCCM at a power level between 400 and 500 watts and a pressure between 400 and 500 millitorr.

11. The method of claim 1 wherein the thickness of said spacers is between 1,500 and 2,500 Angstrom units.

12. The method of claim 1 wherein the material that comprises said capacitor dielectric layer is taken from the group consisting of silicon dioxide, silicon nitride, $SiO_2$—$Si_3N_4$—$SiO_2$ and tantalum oxide.

13. The method of claim 1 wherein the thickness of said capacitor dielectric layer is between 10 and 90 Angstrom units.

14. The method of claim 1 wherein the method used to deposit said capacitor dielectric further comprises:

exposing said second layer of polycrystalline silicon to deionized water;

performing Low Pressure CVD, using silane and ammonia, at between 700° and 800° C. at between 300 and 400 millitorr;

and heating in dry oxygen at between 800° and 900° C. for between 25 and 35 minutes.

15. The method of claim 1 wherein the thickness of said second layer of polycrystalline silicon is between 1,000 and 3,000 Angstrom units.

* * * * *